US012713751B2

(12) United States Patent
Kuboi et al.

(10) Patent No.: US 12,713,751 B2
(45) Date of Patent: Aug. 18, 2026

(54) LIGHT SOURCE DEVICE

(71) Applicant: OLYMPUS MEDICAL SYSTEMS CORP., Tokyo (JP)

(72) Inventors: Toru Kuboi, Machida (JP); Yusuke Yabe, Chofu (JP); Rihito Ishikawa, Musashino (JP)

(73) Assignee: OLYMPUS MEDICAL SYSTEMS CORP., Tokyo (JP)

(*) Notice: Subject to any disclaimer, the term of this patent is extended or adjusted under 35 U.S.C. 154(b) by 456 days.

(21) Appl. No.: 18/243,302

(22) Filed: Sep. 7, 2023

(65) Prior Publication Data

US 2023/0420631 A1 Dec. 28, 2023

Related U.S. Application Data

(63) Continuation of application No. PCT/JP2021/010225, filed on Mar. 12, 2021.

(51) Int. Cl.
*H10H 20/858* (2025.01)
*H10W 90/00* (2026.01)

(52) U.S. Cl.
CPC ........ *H10H 20/8585* (2025.01); *H10W 90/00* (2026.01)

(58) Field of Classification Search
CPC ............... H10H 20/8585; H10W 90/00; A61B 1/00006; A61B 1/00059; A61B 1/0638; A61B 1/0646; A61B 1/0655; A61B 1/0669; A61B 1/0684
See application file for complete search history.

(56) References Cited

U.S. PATENT DOCUMENTS

2009/0303713 A1 12/2009 Chang et al.
2012/0219024 A1* 8/2012 Okamoto ............. H01S 5/0687 372/20
2013/0329416 A1 12/2013 Shimizu et al.
(Continued)

FOREIGN PATENT DOCUMENTS

CN 101603636 A 12/2009
CN 105098041 A 11/2015
(Continued)

OTHER PUBLICATIONS

International Search Report dated Apr. 27, 2021 received in PCT/JP2021/010225.

*Primary Examiner* — Ratisha Mehta
(74) *Attorney, Agent, or Firm* — Scully, Scott, Murphy & Presser, P.C.

(57) ABSTRACT

A light source device includes: a first light source including a first electrode to which a current is applied, a first light emitter configured to emit light by the current applied to the first electrode, and a first heat release region configured to release heat generated in the first light emitter; a second light source including a second electrode to which a current is applied, a second light emitter configured to emit light in a wavelength different from a wavelength of the first light emitter, by the current applied to the second electrode, and a second heat release region configured to release heat generated in the second light emitter; and a heat release portion electrically-connected with the first electrode, electrically-insulated from the second electrode, and thermally connected to the first heat release region and the second heat release region.

9 Claims, 23 Drawing Sheets

(56) References Cited

U.S. PATENT DOCUMENTS

2014/0185739 A1* 7/2014 Tang ........................ H05G 1/70
378/4
2015/0333230 A1 11/2015 Moon et al.

FOREIGN PATENT DOCUMENTS

JP 2004-184613 A 7/2004
JP 2013-254689 A 12/2013
JP 2015-220456 A 12/2015
JP 2019-136555 A 8/2019

* cited by examiner 1
10
ENDOSCOPE OBSERVATION DEVICE
200
IMAGE PROCESSING APPARATUS
100
LIGHT SOURCE DEVICE
114
CONTROL UNIT
115
STORAGE UNIT
113
LIGHT SOURCE CONTROLLER
106
LIGHT SENSOR
107
LIGHT SENSOR
108
LIGHT SENSOR
109
LIGHT SENSOR
110
LIGHT SENSOR
101
AmLD
102
VLED
103
GLD
104
BLED
105
RLED
111
112
20
21
22
23
24
25
SCOPE ID
26
300

Figure 4:
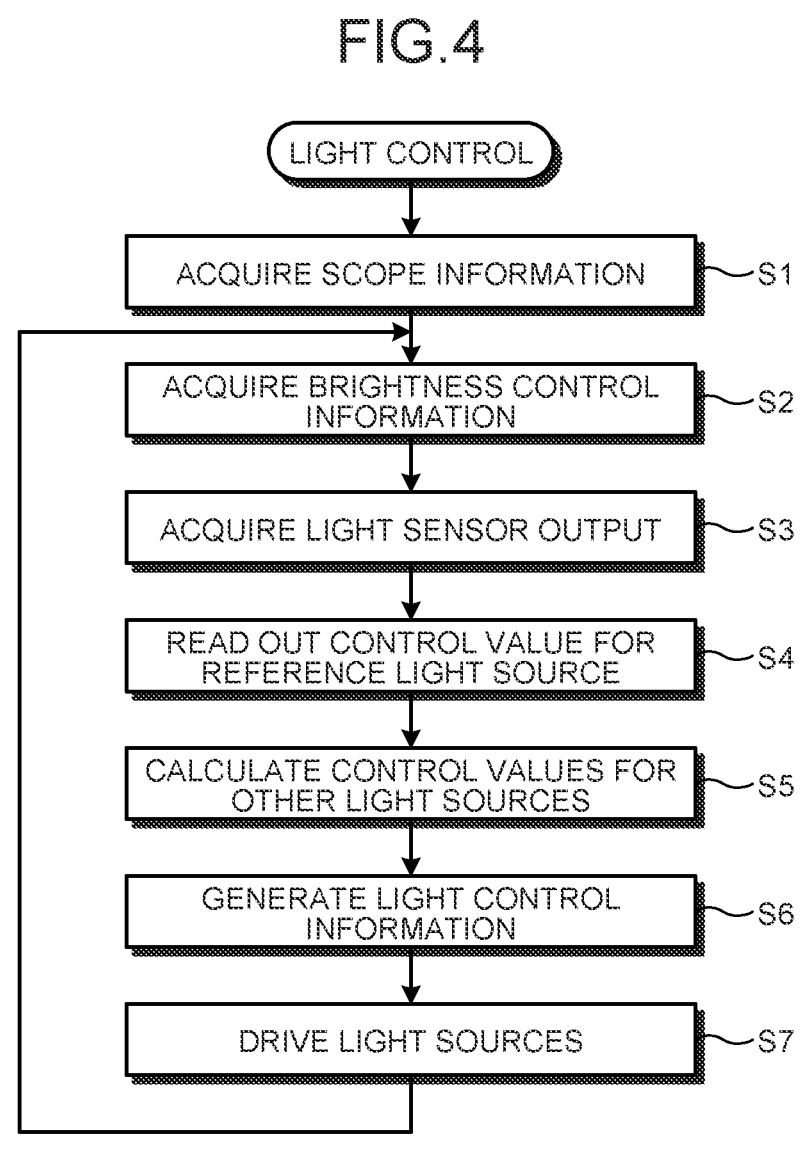

LIGHT CONTROL

ACQUIRE SCOPE INFORMATION ~S1

ACQUIRE BRIGHTNESS CONTROL INFORMATION ~S2

ACQUIRE LIGHT SENSOR OUTPUT ~S3

READ OUT CONTROL VALUE FOR REFERENCE LIGHT SOURCE ~S4

CALCULATE CONTROL VALUES FOR OTHER LIGHT SOURCES ~S5

GENERATE LIGHT CONTROL INFORMATION ~S6

DRIVE LIGHT SOURCES ~S7

FIG.5

| | | COLOR OF SEMICONDUCTOR LIGHT SOURCE | | | | | |
|---|---|---|---|---|---|---|---|
| | | V | B | G | Am | R | TOTAL |
| WLI | **MODE A** | 5 | 10 | 60 | 25 | 30 | 130 |
| NBI | **MODE B** | 30 | 0 | 70 | 0 | 0 | 100 |
| RDI | **MODE C** | 0 | 0 | 10 | 10 | 5 | 25 |
| PRIOR ART CONFIGURATION | | 30 | 10 | 70 | 25 | 30 | 165 |

FIG.6

| | V | B | G | Am | R |
|---|---|---|---|---|---|
| **V** | | 15 | 65 | 30 | 35 |
| **B** | | | 70 | 35 | 40 |
| **G** | | | | 85 | 90 |
| **Am** | | | | | 55 |
| **R** | | | | | |

FIG.7

| | V | B | G | Am | R |
|---|---|---|---|---|---|
| V | | 30 | 100 | 30 | 30 |
| B | | | 70 | 0 | 0 |
| G | | | | 70 | 70 |
| Am | | | | | 10 |
| R | | | | | |

FIG.8

| | V | B | G | Am | R |
|---|---|---|---|---|---|
| V | | 0 | 10 | 10 | 5 |
| B | | | 10 | 10 | 5 |
| G | | | | 20 | 15 |
| Am | | | | | 15 |
| R | | | | | |

FIG.9

| | V | B | G | Am | R |
|---|---|---|---|---|---|
| V | | 30 | 100 | 30 | 35 |
| B | | | 70 | 35 | 40 |
| G | | | | 85 | 90 |
| Am | | | | | 55 |
| R | | | | | |

FIG.10

| | V | B | G | Am | R |
|---|---|---|---|---|---|
| V | | 40 | 100 | 55 | 60 |
| B | | | 80 | 35 | 40 |
| G | | | | 95 | 100 |
| Am | | | | | 55 |
| R | | | | | |

FIG.11

| | V | B | G | Am | R |
|---|---|---|---|---|---|
| V | | -10 | 0 | -25 | -25 |
| B | | | -10 | 0 | 0 |
| G | | | | -10 | -10 |
| Am | | | | | -10 |
| R | | | | | |

FIG.12

| | LIGHT SOURCE A | LIGHT SOURCE B |
|---|---|---|
| HEAT GENERATION AMOUNT:Q | 60W | 50W |
| COOLING TARGET TEMPERATURE:Tj | 130°C | 90°C |
| SURROUNDING ENVIRONMENT TEMPERATURE:Ta | 40°C | 40°C |
| ALLOWABLE TEMPERATURE RISE: $\Delta T$ | 90°C | 50°C |
| ALLOWABLE THERMAL RESISTANCE: $R_{th}$ | <1.5(°C/W) | <1.0(°C/W) |
| HEAT CONDUCTANCE: $C_{th}$ | >1/1.5≈0.67 | >1.0 |
| | ↓ | ↓ |
| HEAT RELEASING DEVICE SIZE | SMALL | LARGE |

FIG.13

| | | COLOR OF SEMICONDUCTOR LIGHT SOURCE | | | | |
|---|---|---|---|---|---|---|
| | | V | B | G | Am | R |
| | TARGET Tj⇒ | 130 | 130 | 130 | 90 | 90 |
| WLI | MODE A | 18.0 | 9.0 | 1.5 | 2.0 | 1.7 |
| NBI | MODE B | 3.0 | - | 1.3 | - | - |
| RDI | MODE C | - | - | 9.0 | 5.0 | 10.0 |
| PRIOR ART CONFIGURATION | | 3.0 | 9.0 | 1.3 | 2.0 | 1.7 |

FIG.14

| | | COLOR OF SEMICONDUCTOR LIGHT SOURCE | | | | |
|---|---|---|---|---|---|---|
| | | V | B | G | Am | R |
| | TARGET Tj⇒ | 130 | 130 | 130 | 90 | 90 |
| WLI | MODE A | 0.06 | 0.11 | 0.67 | 0.50 | 0.60 |
| NBI | MODE B | 0.33 | - | 0.78 | - | - |
| RDI | MODE C | - | - | 0.11 | 0.20 | 0.10 |
| PRIOR ART CONFIGURATION | | 0.33 | 0.11 | 0.78 | 0.50 | 0.60 |

FIG.15

| | V | B | G | Am | R |
|---|---|---|---|---|---|
| V | | 0.33 | 1.11 | 0.56 | 0.66 |
| B | | | 0.78 | 0.61 | 0.71 |
| G | | | | 1.17 | 1.27 |
| Am | | | | | 1.10 |
| R | | | | | |

FIG.16

| | V | B | G | Am | R |
|---|---|---|---|---|---|
| V | | 0.44 | 1.11 | 0.83 | 0.93 |
| B | | | 0.89 | 0.61 | 0.71 |
| G | | | | 1.28 | 1.38 |
| Am | | | | | 1.10 |
| R | | | | | |

FIG.17

| | V | B | G | Am | R |
|---|---|---|---|---|---|
| V | | 0.11 | 0.00 | 0.28 | 0.28 |
| B | | | 0.11 | 0.00 | 0.00 |
| G | | | | 0.11 | 0.11 |
| Am | | | | | 0.00 |
| R | | | | | |

| | | | | | | | | | | | |
|---|---|---|---|---|---|---|---|---|---|---|---|
| V B G | 75 | | | | | | | | | | |
| V B Am | 40 | V G Am | 90 | | | B G Am | 95 | | | | |
| V B R | 45 | V G R | 95 | V Am R | 60 | B G R | 100 | B Am R | 100 | G Am R | 115 |

FIG.20

| | | | | | | | | | | | |
|---|---|---|---|---|---|---|---|---|---|---|---|
| V B G | 100 | | | | | | | | | | |
| V B Am | 30 | V G Am | 100 | | | B G Am | 70 | | | | |
| V B R | 30 | V G R | 100 | V Am R | 30 | B G R | 70 | B Am R | 0 | G Am R | 70 |

FIG.21

| | | | | | | | | | | | |
|---|---|---|---|---|---|---|---|---|---|---|---|
| V B G | 10 | | | | | | | | | | |
| V B Am | 10 | V G Am | 100 | | | B G Am | 20 | | | | |
| V B R | 5 | V G R | 15 | V Am R | 15 | B G R | 15 | B Am R | 15 | G Am R | 25 |

FIG.22

| | | | | | | | | | | | |
|---|---|---|---|---|---|---|---|---|---|---|---|
| V B G | 100 | | | | | | | | | | |
| V B Am | 40 | V G Am | 100 | | | B G Am | 95 | | | | |
| V B R | 45 | V G R | 100 | V Am R | 60 | B G R | 100 | B Am R | 100 | G Am R | 115 |

FIG.23

| | | | | | | | | | | | |
|---|---|---|---|---|---|---|---|---|---|---|---|
| V B G | 110 | | | | | | | | | | |
| V B Am | 65 | V G Am | 125 | | | B G Am | 15 | | | | |
| V B R | 70 | V G R | 130 | V Am R | 85 | B G R | 15 | B Am R | 15 | G Am R | 25 |

FIG.24

| | | | | | | | | | | | |
|---|---|---|---|---|---|---|---|---|---|---|---|
| V B G | -10 | | | | | | | | | | |
| V B Am | 35 | V G Am | -25 | | | B G Am | 80 | | | | |
| V B R | 30 | V G R | -30 | V Am R | -25 | B G R | 80 | B Am R | 85 | G Am R | 90 |

116
600
Ar
112
605
6052
6053
6051
6054
6055
622
604
6042
6043
6041
6044
6045
603
6032
6033
6031
6034
6035
621
602
6022
6023
6021
6024
6025
601
6012
6013
6011
6014
6015
620

| No. | V | B | G | Am | R |
|---|---|---|---|---|---|
| 1 | ◎ | ◎ | ● | ● | |
| 2 | ◎ | ◎ | ● | | ● |
| 3 | ◎ | ◎ | | ● | ● |
| 4 | ◎ | ● | ◎ | ● | |
| 5 | ◎ | ● | ◎ | | ● |
| 6 | ◎ | | ◎ | ● | ● |
| 7 | ◎ | ● | ● | ◎ | |
| 8 | ◎ | ● | | ◎ | ● |
| 9 | ◎ | | ● | ◎ | ● |
| 10 | ◎ | ● | ● | | ◎ |
| 11 | ◎ | ● | | ● | ◎ |
| 12 | ◎ | | ● | ● | ◎ |
| 13 | ● | ◎ | ◎ | ● | |
| 14 | ● | ◎ | ◎ | | ● |
| 15 | | ◎ | ◎ | ● | ● |
| 16 | ● | ◎ | ● | ◎ | |
| 17 | ● | ◎ | | ◎ | ● |
| 18 | | ◎ | ● | ◎ | ● |
| 19 | ● | ◎ | ● | | ◎ |
| 20 | ● | ◎ | | ● | ◎ |
| 21 | | ◎ | ● | ● | ◎ |

| | No.1 | No.2 | No.3 | No.4 | No.5 | No.6 | No.7 | No.8 | No.9 | No.10 | No.11 | No.12 | No.13 | No.14 | No.15 | No.16 | No.17 | No.18 | No.19 | No.20 | No.21 |
|---|---|---|---|---|---|---|---|---|---|---|---|---|---|---|---|---|---|---|---|---|---|
| SHARE A | 15 | 15 | 15 | 65 | 65 | 65 | 30 | 30 | 30 | 35 | 35 | 35 | 70 | 70 | 70 | 35 | 35 | 35 | 40 | 40 | 40 |
| SHARE B | 85 | 90 | 55 | 35 | 40 | 55 | 70 | 40 | 90 | 70 | 35 | 85 | 30 | 35 | 55 | 65 | 35 | 90 | 65 | 30 | 85 |
| INDE-PENDENT | 30 | 25 | 60 | 30 | 25 | 10 | 30 | 60 | 10 | 25 | 60 | 10 | 30 | 25 | 5 | 30 | 60 | 5 | 25 | 60 | 10 |
| TOTAL | 130 | 130 | 130 | 130 | 130 | 130 | 130 | 130 | 130 | 130 | 130 | 130 | 130 | 130 | 130 | 130 | 130 | 130 | 130 | 130 | 135 |

FIG.28

| | No.1 | No.2 | No.3 | No.4 | No.5 | No.6 | No.7 | No.8 | No.9 | No.10 | No.11 | No.12 | No.13 | No.14 | No.15 | No.16 | No.17 | No.18 | No.19 | No.20 | No.21 |
|---|---|---|---|---|---|---|---|---|---|---|---|---|---|---|---|---|---|---|---|---|---|
| SHARE A | 30 | 30 | 30 | 100 | 100 | 100 | 30 | 30 | 30 | 30 | 30 | 30 | 70 | 70 | 70 | 0 | 0 | 0 | 0 | 0 | 0 |
| SHARE B | 70 | 70 | 0 | 0 | 0 | 0 | 70 | 0 | 70 | 70 | 0 | 70 | 30 | 30 | 0 | 100 | 30 | 70 | 100 | 30 | 70 |
| INDE-PENDENT | 0 | 0 | 70 | 0 | 0 | 0 | 0 | 70 | 0 | 0 | 70 | 0 | 0 | 0 | 30 | 0 | 70 | 30 | 0 | 70 | 0 |
| TOTAL | 100 | 100 | 100 | 100 | 100 | 100 | 100 | 100 | 100 | 100 | 100 | 100 | 100 | 100 | 100 | 100 | 100 | 100 | 100 | 100 | 70 |

FIG.29

| | No.1 | No.2 | No.3 | No.4 | No.5 | No.6 | No.7 | No.8 | No.9 | No.10 | No.11 | No.12 | No.13 | No.14 | No.15 | No.16 | No.17 | No.18 | No.19 | No.20 | No.21 |
|---|---|---|---|---|---|---|---|---|---|---|---|---|---|---|---|---|---|---|---|---|---|
| SHARE A | 0 | 0 | 0 | 10 | 10 | 10 | 10 | 10 | 10 | 5 | 5 | 5 | 10 | 10 | 10 | 10 | 10 | 10 | 5 | 5 | 5 |
| SHARE B | 20 | 15 | 15 | 10 | 5 | 15 | 10 | 5 | 15 | 10 | 10 | 20 | 10 | 5 | 15 | 10 | 5 | 15 | 10 | 10 | 20 |
| INDE-PENDENT | 5 | 10 | 10 | 5 | 10 | 0 | 5 | 10 | 0 | 10 | 10 | 0 | 5 | 10 | 0 | 5 | 10 | 0 | 10 | 10 | 0 |
| TOTAL | 25 | 25 | 25 | 25 | 25 | 25 | 25 | 25 | 25 | 25 | 25 | 25 | 25 | 25 | 25 | 25 | 25 | 25 | 25 | 25 | 25 |

FIG. 30

| | No.1 | No.2 | No.3 | No.4 | No.5 | No.6 | No.7 | No.8 | No.9 | No.10 | No.11 | No.12 | No.13 | No.14 | No.15 | No.16 | No.17 | No.18 | No.19 | No.20 | No.21 |
|---|---|---|---|---|---|---|---|---|---|---|---|---|---|---|---|---|---|---|---|---|---|
| SHARE A | 30 | 30 | 30 | 100 | 100 | 100 | 30 | 30 | 30 | 35 | 35 | 35 | 70 | 70 | 70 | 35 | 35 | 35 | 40 | 40 | 40 |
| SHARE B | 85 | 90 | 55 | 35 | 40 | 55 | 70 | 40 | 90 | 70 | 35 | 85 | 30 | 35 | 55 | 100 | 35 | 90 | 100 | 30 | 85 |
| INDE-PENDENT | 30 | 25 | 70 | 30 | 25 | 10 | 30 | 70 | 10 | 25 | 70 | 10 | 30 | 25 | 30 | 30 | 70 | 30 | 25 | 70 | 10 |
| TOTAL | 145 | 145 | 155 | 165 | 165 | 165 | 130 | 140 | 130 | 130 | 140 | 130 | 130 | 130 | 155 | 165 | 140 | 155 | 165 | 140 | 135 |

FIG. 31

| | No.1 | No.2 | No.3 | No.4 | No.5 | No.6 | No.7 | No.8 | No.9 | No.10 | No.11 | No.12 | No.13 | No.14 | No.15 | No.16 | No.17 | No.18 | No.19 | No.20 | No.21 |
|---|---|---|---|---|---|---|---|---|---|---|---|---|---|---|---|---|---|---|---|---|---|
| SHARE A | 40 | 40 | 40 | 100 | 100 | 100 | 55 | 55 | 55 | 60 | 60 | 60 | 80 | 80 | 80 | 35 | 35 | 35 | 40 | 40 | 40 |
| SHARE B | 95 | 100 | 55 | 35 | 40 | 55 | 80 | 40 | 100 | 80 | 35 | 95 | 55 | 60 | 55 | 100 | 60 | 100 | 100 | 55 | 95 |
| INDE-PENDENT | 30 | 25 | 70 | 30 | 25 | 10 | 30 | 70 | 10 | 25 | 70 | 10 | 30 | 25 | 30 | 30 | 70 | 30 | 25 | 70 | 10 |
| TOTAL | 165 | 165 | 165 | 165 | 165 | 165 | 165 | 165 | 165 | 165 | 165 | 165 | 165 | 165 | 165 | 165 | 165 | 165 | 165 | 165 | 145 |

FIG. 32

| | No.1 | No.2 | No.3 | No.4 | No.5 | No.6 | No.7 | No.8 | No.9 | No.10 | No.11 | No.12 | No.13 | No.14 | No.15 | No.16 | No.17 | No.18 | No.19 | No.20 | No.21 |
|---|---|---|---|---|---|---|---|---|---|---|---|---|---|---|---|---|---|---|---|---|---|
| SHARE A | -10 | -10 | -10 | 0 | 0 | 0 | -25 | -25 | -25 | -25 | -25 | -25 | -10 | -10 | -10 | 0 | 0 | 0 | 0 | 0 | 0 |
| SHARE B | -10 | -10 | 0 | 0 | 0 | 0 | -10 | 0 | -10 | -10 | 0 | -10 | -25 | -25 | 0 | 0 | -25 | -10 | 0 | -25 | -10 |
| INDE-PENDENT | 0 | 0 | 0 | 0 | 0 | 0 | 0 | 0 | 0 | 0 | 0 | 0 | 0 | 0 | 0 | 0 | 0 | 0 | 0 | 0 | 0 |
| TOTAL→RECALCU-LATION | -20 | -20 | -10 | 0 | 0 | 0 | -35 | -25 | -35 | -35 | -25 | -35 | -35 | -35 | -10 | 0 | -25 | -10 | 0 | -25 | -10 |

LIGHT SOURCE DEVICE

CROSS-REFERENCE TO RELATED APPLICATION

This application is a continuation of International Application No. PCT/JP2021/010225, filed on Mar. 12, 2021, the entire contents of which are incorporated herein by reference.

BACKGROUND

1. Technical Field

The present disclosure relates to a light source device.

2. Related Art

To reduce burden on medical service workers during endoscope observation, devices included in an endoscope observation system are required to be downsized. Endoscope systems include an endoscope system that can switch an observation mode between modes such as white light imaging (WLI) that uses white light, narrow band imaging (NBI) that uses blue and green narrow-bandwidth light, and red dichromatic imaging (RDI) that uses two types of red narrow-bandwidth light and green illumination light. A light source device included in such an endoscope observation system includes a plurality of light sources that produce light rays in mutually-different wavelengths (for example, refer to JP 2019-136555 A).

Further, JP 2004-184613 A discloses a technique of downsizing a light source device by mounting a plurality of light sources on one heat release board. In the case of using an insulated light source such as a laser diode (LD) in which an electrode and a heat release portion that releases heat generated in a light emitter are insulated, even if a plurality of light sources is mounted on one heat release portion, because electrodes of the respective light sources are insulated, light amounts of the respective light sources can be individually controlled.

SUMMARY

In some embodiments, a light source device includes: a first light source including a first electrode to which a current is applied, a first light emitter configured to emit light by the current applied to the first electrode, and a first heat release region configured to release heat generated in the first light emitter; a second light source including a second electrode to which a current is applied, a second light emitter configured to emit light in a wavelength different from a wavelength of the first light emitter, by the current applied to the second electrode, and a second heat release region configured to release heat generated in the second light emitter; and a heat release portion electrically-connected with the first electrode, electrically-insulated from the second electrode, and thermally connected to the first heat release region and the second heat release region.

The above and other features, advantages and technical and industrial significance of this disclosure will be better understood by reading the following detailed description of presently preferred embodiments of the disclosure, when considered in connection with the accompanying drawings.

BRIEF DESCRIPTION OF THE DRAWINGS

FIG. 4 is a flowchart illustrating an example of light control processing in the light source device;

FIG. 5 is a diagram illustrating a heat generation amount of each light source;

FIG. 6 is a diagram illustrating a heat generation amount in a mode A;

FIG. 7 is a diagram illustrating a heat generation amount in a mode B;

FIG. 8 is a diagram illustrating a heat generation amount in a mode C;

FIG. 9 is a diagram illustrating a maximum heat generation amount among all modes;

FIG. 10 is a diagram illustrating a heat generation amount obtained in a case where each light source independently includes a heat release portion;

FIG. 11 is a diagram illustrating an effect obtained by sharing a heat release portion;

FIG. 12 is a diagram illustrating an example of light sources included in a light source device according to a second embodiment;

FIG. 13 is a diagram illustrating an allowable thermal resistance of each light source;

FIG. 14 is a diagram illustrating a heat conductance of each light source;

FIG. 15 is a diagram illustrating a maximum heat conductance among all modes;

FIG. 16 is a diagram illustrating a heat conductance obtained in a case where each light source independently includes a heat release portion;

FIG. 17 is a diagram illustrating an effect obtained by sharing a heat release portion;

FIG. 19 is a diagram illustrating a sum of heat generation amounts obtained in a case where three light sources share a heat release portion in the mode A;

FIG. 20 is a diagram illustrating a sum of heat generation amounts obtained in a case where three light sources share a heat release portion in the mode B;

FIG. 21 is a diagram illustrating a sum of heat generation amounts obtained in a case where three light sources share a heat release portion in the mode C;

FIG. 22 is a diagram illustrating a maximum heat generation amount among all modes;

FIG. 23 is a diagram illustrating a heat generation amount obtained in a case where each light source independently includes a heat release portion;

FIG. 24 is a diagram illustrating an effect obtained by sharing a heat release portion;

FIG. 26 is a diagram illustrating a pattern for sharing a heat release portion by two sets each including two light sources;

FIG. 27 is a diagram illustrating a sum of heat generation amounts of each pattern in the mode A;

FIG. 28 is a diagram illustrating a sum of heat generation amounts of each pattern in the mode B.

FIG. 29 is a diagram illustrating a sum of heat generation amounts of each pattern in the mode C;

FIG. 30 is a diagram illustrating a maximum heat generation amount among all modes;

FIG. 31 is a diagram illustrating a heat generation amount obtained in a case where each light source independently includes a heat release portion; and FIG. 32 is a diagram illustrating an effect obtained by sharing a heat release portion;

DETAILED DESCRIPTION

Figure 1:
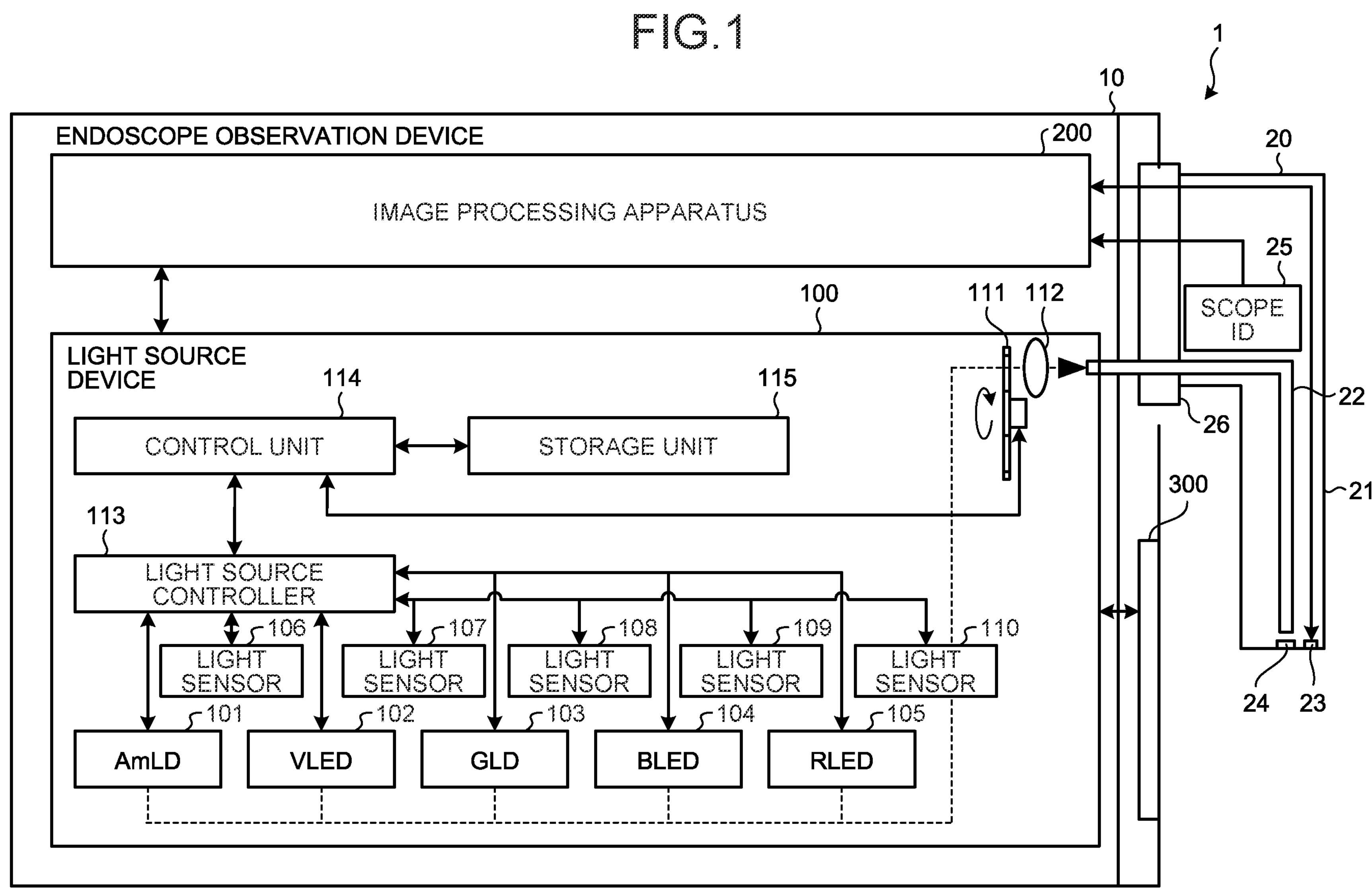
FIG. 1 is a schematic diagram illustrating a configuration of an endoscope observation system including a light source device according to a first embodiment.

Hereinafter, embodiments of a light source device according to the disclosure will be described with reference to the drawings. In addition, the disclosure is not limited by these embodiments. In the following embodiments, the description will be given while exemplifying a light source device including five light sources with mutually-different wavelengths, but the disclosure can be generally applied to a light source device including a non-insulated light source.

Further, in the description of the drawings, the same or corresponding elements are appropriately assigned the same signs. Further, it should also be noted that the drawings are schematic drawings, and a dimensional relationship between elements, proportion of elements, and the like sometimes differ from reality. Also in the drawings, parts mutually-different in dimensional relationship and proportion are sometimes included.

First Embodiment

FIG. 1 is a schematic diagram illustrating a configuration of an endoscope observation system including a light source device according to a first embodiment. As illustrated in FIG. 1, an endoscope observation system 1 according to this first embodiment includes an endoscope observation device 10 and an endoscope 20.

The endoscope observation device 10 includes a light source device 100, an image processing apparatus 200, and an operation panel device 300. The endoscope observation device 10 is an endoscope observation device that enables observation in a plurality of observation modes such as WLI of performing observation while emitting normal white light, NBI of observing blood vessels while emitting blue and green narrow-bandwidth light, and RDI of observing mucosa located behind blood vessels, or the like while emitting two types of red narrow-bandwidth light and green illumination light.

The light source device 100 includes an Amber (hereinafter, will be described as "Am") LD 101, a Violet (hereinafter, will be described as "V") LED 102, a Green (hereinafter, will be described as "G") LD 103, a Blue (hereinafter, will be described as "B") LED 104, a Red (hereinafter, will be described as "R") LED 105, light sensors 106 to 110, a rotating filter 111, a lens 112, a light source controller 113, a control unit 114, and a storage unit 115.

Figure 2:
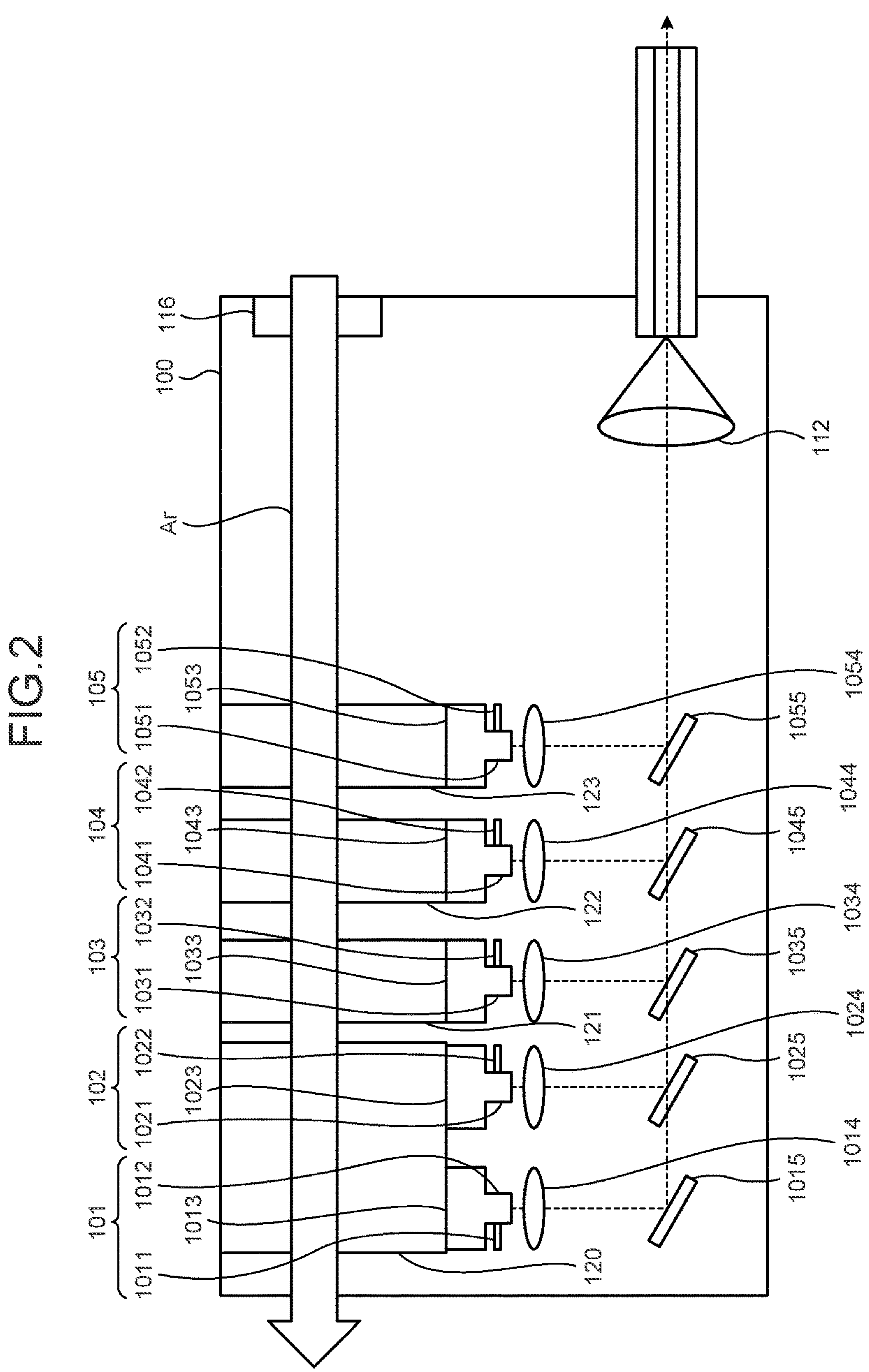
FIG. 2 is a schematic diagram illustrating a configuration of the light source device illustrated in FIG. 1.

FIG. 2 is a schematic diagram illustrating a configuration of the light source device illustrated in FIG. 1. As illustrated in FIG. 2, light sources from the AmLD 101 to the RLED 105 respectively include electrodes 1011 to 1051 to which currents are applied, light emitters 1012 to 1052 that emit light rays in mutually-different wavelengths by the currents applied to the electrodes 1011 to 1051, and heat release regions 1013 to 1053 that release heat generated in the light emitters 1012 to 1052. Further, the light source device 100 includes a blower unit 116, lenses 1014 to 1054, and dichroic mirrors 1015 to 1055.

The VLED 102, the BLED 104, and the RLED 105, which serve as a first light source, are LEDs, for example. Because an electrode and a heat release region are not electrically-insulated in a general LED, in the VLED 102, the electrode 1021 and the heat release region 1023 are electrically-connected. Similarly, in the BLED 104, the electrode 1041 and the heat release region 1043 are electrically-connected. Similarly, in the RLED 105, the electrode 1051 and the heat release region 1053 are electrically-connected.

The AmLD 101 and the GLD 103, which serve as a second light source, are LDs, for example. Because an electrode and a heat release region are electrically-insulated in a general LD, in the AmLD 101, the electrode 1011 and the heat release region 1013 are electrically-insulated. Similarly, in the GLD 103, the electrode 1031 and the heat release region 1033 are electrically-insulated. Nevertheless, the AmLD 101 and the GLD 103 are only required to be light sources in which electrodes and heat release regions are electrically-insulated, and each may be an LED in which an electrode and a heat release region are electrically-insulated, or an LED in which an electrode and a heat release region are electrically-connected, and an insulation portion positioned between the heat release region and a heat release portion is included. The insulation portion is made of thermal interface material (TIM) being insulating material with good thermal conductivity, for example.

The AmLD 101 and the VLED 102 are mounted on a heat release portion 120. In other words, the AmLD 101 and the VLED 102 use one heat release portion 120 in common. Then, because the electrode 1021 and the heat release region 1023 of the VLED 102 are electrically-connected, the electrode 1021 and the heat release portion 120 are electrically-connected, and because the electrode 1011 and the heat release region 1013 of the AmLD 101 are electrically-insulated, the electrode 1011 and the heat release portion 120 are electrically-insulated. Accordingly, because the electrode 1011 and the electrode 1021 are electrically-insulated from each other, by controlling currents to be applied to the electrode 1011 and the electrode 1021, it is possible to individually control light amounts of the AmLD 101 and the VLED 102.

Further, the GLD 103 is mounted on a heat release portion 121. The BLED 104 is mounted on a heat release portion 122. The RLED 105 is mounted on a heat release portion 123. As described above, because the electrodes 1011 to 1051 are electrically-insulated from each other, it is possible to individually control light amounts of the light sources from the AmLD 101 to the RLED 105. In addition, because light sources from the GLD 103 to the RLED 105 are independently mounted on the respective heat release portions 121 to 123, their electrodes and heat release regions need not be electrically-insulated, but may be insulated.

The lenses 1014 to 1054 condense light rays respectively emitted by the light sources from the AmLD 101 to the RLED 105, and convert the light rays into approximately parallel light rays.

The dichroic mirrors 1015 to 1055 reflect light rays in wavebands of light rays respectively emitted by the light sources from the AmLD 101 to the RLED 105, and let through light rays in other wavebands.

Referring back to FIG. 1, the light sensors 106 to 110 respectively measure intensities of light rays emitted by the light sources from the AmLD 101 to the RLED 105, and output measurement results to the control unit 114.

Under the control executed by the control unit 114, the rotating filter 111 arranges a filter for removing unnecessary light, on an optical path in accordance with an observation mode.

The lens 112 condenses light rays emitted by the light sources from the AmLD 101 to the RLED 105, to a light guide 22.

By independently controlling currents to be applied to the electrodes 1011 to 1051, the light source controller 113 controls light amounts of light rays emitted by the light sources from the AmLD 101 to the RLED 105.

The control unit 114 comprehensively controls the light source device 100. The control unit 114 is formed using a general-purpose processor such as a central processing unit (CPU), or a dedicated processor such as various arithmetic circuits that execute specific functions such as an application specific integrated circuit (ASIC).

The storage unit 115 stores various programs for operating the light source device 100. The storage unit 115 can also widely-distribute the various programs by recording the various programs on a computer-readable recording medium such as a hard disc, a flash memory, a CD-ROM, a DVD-ROM, and a flexible disk. In addition, the aforementioned various programs can also be acquired by being downloaded via a communication network. The communication network here is implemented by, for example, an existing public line network, a local area network (LAN), a wide area network (WAN), or the like, and may be a wired network or a wireless network.

The storage unit 115 having the above configuration is implemented by using a read only memory (ROM) on which various programs and the like are preinstalled, a random access memory (RAM) or a hard disc storing calculation parameters, data, and the like of each processing, and the like.

The blower unit 116 (refer to FIG. 2) is a fan in which a motor rotates blades using an applied current, for example, and cools the heat release portions 120 to 123 by blowing air in accordance with an arrow Ar.

The heat release portions 120 to 123 are made of material having good electric and thermal conductivities, such as copper or aluminum. The heat release portion 120 is thermally connected to the heat release regions 1013 and 1023. Further, the heat release portion 120 has a surface area set based on the heat generation amounts of the AmLD 101 and the VLED 102. Similarly, the heat release portions 121 to 123 are thermally connected to the heat release regions 1033 to 1053, respectively. Further, the heat release portions 121 to 123 have surface areas set based on the heat generation amounts of the respective light sources from the GLD 103 to the RLED 105.

Figure 3:
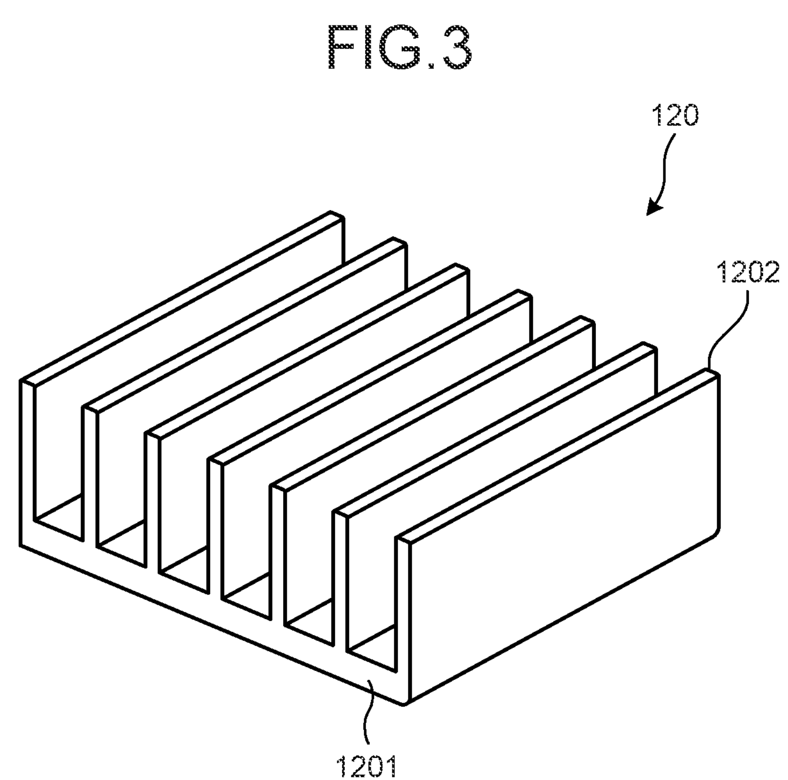
FIG. 3 is a perspective view of a heat release portion illustrated in FIG. 2.

FIG. 3 is a perspective view of a heat release portion illustrated in FIG. 2. As illustrated in FIG. 3, the heat release portion 120 includes a joined portion 1201 joined to the heat release region 1013 and the heat release region 1023, and a fin 1202 formed into a sheet to increase a surface area. Similarly, the heat release portions 121 to 123 include joined portions joined to the respective heat release regions 1033 to 1053, and fins into sheets to increase surface areas. The heat release portions 120 to 123 are arranged in such a manner that the fins become parallel to the arrow Ar in FIG. 2.

The image processing apparatus 200 receives image data obtained by imaging executed by an imaging unit 24, and a scope ID from the endoscope 20, and performs various types of signal processing corresponding to the scope ID, on the image data.

The operation panel device 300 includes a touch panel, an operation switch, and the like, for example, and receives operation input made by a user. A signal generated in accordance with the operation input received by the operation panel device 300 is output to the control unit 114.

Further, a current setting value of the light source device 100, and the like can be displayed on the operation panel device 300.

The endoscope 20 includes an insertion portion 21 to be inserted into a subject, the light guide 22 that guides light emitted by the light source device 100, to a distal end of the insertion portion 21, a lens 23 that emits the light guided by the light guide 22, into the subject, the imaging unit 24 that captures an image of the inside of the subject, a scope ID transmission unit 25 that transmits a scope ID to the image processing apparatus 200, and a connector 26 to be connected to the endoscope observation device 10.

The imaging unit 24 includes an optical system that condenses light reflected inside the subject, and an image sensor that receives light condensed by the optical system, photoelectrically converts the received light into an electric signal, and performs signal processing on the electric signal. The image sensor is implemented by using a charge coupled device (CCD) image sensor or a complementary metal oxide semiconductor (CMOS) image sensor, for example.

Next, light control executed by the light source device 100 will be described. FIG. 4 is a flowchart illustrating an example of light control processing in the light source device. As illustrated in FIG. 4, first of all, the light source device 100 acquires scope information including a scope ID, from the endoscope 20 (Step S1).

Subsequently, the control unit 114 acquires brightness control information corresponding to the scope ID, from the storage unit 115 (Step S2). Then, under the control executed by the control unit 114, the light source controller 113 applies current corresponding to the brightness control information, to the light sources from the AmLD 101 to the RLED 105.

After that, the control unit 114 acquires outputs of the light sensors 106 to 110 (Step S3).

Furthermore, the control unit 114 reads out, from the storage unit 115, a control value for a reference light source preliminarily-selected from among the light sources from the AmLD 101 to the RLED 105 (Step S4).

Then, the control unit 114 calculates control values for other light sources other than the reference light source (Step S5).

The control unit 114 generates light control information including the calculated control value for each light source (Step S6).

Then, under the control executed by the control unit 114, the light source controller 113 drives the light sources from the AmLD 101 to the RLED 105 by individually applying currents corresponding to the light control information, to the light sources from the AmLD 101 to the RLED 105 (Step S7).

Next, an effect obtained by sharing a heat release portion will be described. FIG. 5 is a diagram illustrating a heat generation amount of each light source. In the diagrams to be described below, a predetermined hatching is appropriately applied to non-insulated light sources (AmLD 101 and GLD 103). As illustrated in FIG. 5, because light amounts of light rays emitted by the light sources from the AmLD 101 to the RLED 105 vary between a mode A for performing WLI observation, a mode B for performing NBI observation, and a mode C for performing RDI observation, heat generation amounts vary. For example, heat generation amounts of the VLED 102 are 5 W in the mode A, 30 W in the mode B, and 0 W in the mode C. Because a heat release portion is selected in such a manner that heat can be released in a mode in which a heat generation amount is the highest, in a case where the light sources from the AmLD 101 to the RLED 105 are individually mounted the respective heat release portions as in the configuration disclosed by the prior art, heat release portions that can release heats at 30 W, 10 W, 70 W, 25 W, and 30 W, respectively, are required, and heat release portions that can release heats at 165 W in total are required.

FIG. 6 is a diagram illustrating a heat generation amount in the mode A. FIG. 6 illustrates a total heat generation amount obtained in a case where a light source listed in a lengthwise direction, and a light source listed in a traverse direction are mounted on one heat release portion. For example, in a case where the VLED 102 and the BLD 104 are mounted on one heat release portion, by adding 5 W being the heat generation amount of the VLED 102 in the mode A, and 10 W being the heat generation amount of the BLD 104 in the mode A, which are illustrated in FIG. 5, the total heat generation amount becomes 15 W.

FIG. 7 is a diagram illustrating a heat generation amount in the mode B. Similarly to FIG. 6, FIG. 7 illustrates a total heat generation amount obtained in a case where a light source listed in a lengthwise direction, and a light source listed in a traverse direction are mounted on one heat release portion For example, in a case where the VLED 102 and the BLD 104 are mounted on one heat release portion, by adding 30 W being the heat generation amount of the VLED 102 in the mode B, and 0 W being the heat generation amount of the BLD 104 in the mode B, which are illustrated in FIG. 5, the total heat generation amount becomes 30 W.

FIG. 8 is a diagram illustrating a heat generation amount in the mode C. Similarly to FIG. 6, FIG. 8 illustrates a total heat generation amount obtained in a case where a light source listed in a lengthwise direction, and a light source listed in a traverse direction are mounted on one heat release portion For example, in a case where the VLED 102 and the BLD 104 are mounted on one heat release portion, by adding 0 W being the heat generation amount of the VLED 102 in the mode C, and 0 W being the heat generation amount of the BLD 104 in the mode C, which are illustrated in FIG. 5, the total heat generation amount becomes 0 W.

FIG. 9 is a diagram illustrating a maximum heat generation amount among all modes. That is, FIG. 9 illustrates maximum values of the values illustrated in FIGS. 6 to 8. For example, in a case where the VLED 102 and the BLD 104 are mounted on one heat release portion, because the heat generation amount in the mode A is 15 W (refer to FIG. 6), the heat generation amount in the mode B is 30 W (refer to FIG. 7), and the heat generation amount in the mode C is 0 W (refer to FIG. 8), the maximum heat generation amount becomes 30 W.

FIG. 10 is a diagram illustrating a heat generation amount obtained in a case where each light source independently includes a heat release portion. That is, FIG. 10 illustrates a sum of heat generation amounts illustrated on the bottommost row in FIG. 5. For example, in a case where the VLED 102 and the BLD 104 are independently mounted on the respective heat release portions, by adding 30 W being the heat generation amount of the VLED 102, and 10 W being the heat generation amount of the BLD 104, which are illustrated in FIG. 5, the total heat generation amount becomes 40 W.

FIG. 11 is a diagram illustrating an effect obtained by sharing a heat release portion. FIG. 11 illustrates values obtained by subtracting the values in FIG. 10, from the values in FIG. 9. Nevertheless, if two light sources are mounted on one heat release portion in combinations to which diagonal hatchings are applied in FIG. 11, because electrodes of the respective light sources enter a mutually-non-insulated state, it becomes unable to individually control light amounts of the light emitters. Accordingly, in the case of individually controlling light amounts of the light emitters, it is impossible to mount two light sources on one heat release portion in the combinations to which diagonal hatchings are applied in FIG. 11.

In a case where the VLED 102 and the AmLD 101, which have a maximum absolute value among combinations to which diagonal hatchings are not applied in FIG. 11, are mounted on one heat release portion, as seen from FIG. 9, it is sufficient that the VLED 102 and the AmLD 101 are mounted on the heat release portion 120 that can release heat of a light source with a heat generation amount of 30 W. In contrast to this, in the prior art, because the VLED 102 and the AmLD 101 are independently mounted on heat release portions, as seen from FIG. 10, a heat release portion that can release heat of a light source with a heat generation amount of 55 W has been required. Accordingly, in a case where the VLED 102 and the AmLD 101 are mounted on one heat release portion 120 as in the first embodiment, the heat release portion 120 with heat release capability smaller by 25 W as compared with that in the prior art can be employed. Because the heat release portion 120 has a surface area set based on the heat generation amounts of the AmLD 101 and the VLED 102, according to the first embodiment, the light source device 100 including a non-insulated light source (VLED 102) can be downsized.

Second Embodiment

In the first embodiment, a surface area of a heat release portion is set based on a heat generation amount of a light source, but a surface area of a heat release portion may be set based on a heat conductance of each light source. Because the configuration in the second embodiment is similar to the configuration in the first embodiment that is illustrated in FIGS. 1 and 2, the description will be omitted.

FIG. 12 is a diagram illustrating an example of light sources included in a light source device according to the second embodiment. As illustrated in FIG. 12, there are two types of light sources corresponding to a light source A and a light source B, as an example, heat generation amounts Q of the respective light sources are assumed to be 60 W and 50 W. A cooling target temperature Tj is set based on a temperature allowed by each light source, and their respective cooling target temperatures are set to 130° C. and 90° C. In a case where surrounding environment temperatures Ta of the respective light sources are set to 40° C., their respective allowable temperature rises $\Delta T = Tj - Ta$ are 90° C. and 50° C. Then, their respective allowable thermal resistances $R_{th} = \Delta T/Q$ are only required to be 1.5° C./W or less and 1.0° C./W or less. Furthermore, their respective heat conductances $C_{th} = 1/R_{th}$ (W/° C.) are only required to be larger than 0.67 and 1.0. A size of a heat release portion of the light source A with a small heat conductance may be small, but a size of a heat release portion of the light source B with a large heat conductance needs to be made large. As described above, the heat release portion of the light source B with a smaller heat generation amount Q is desirably made larger than that of the light source A with a larger heat generation amount Q in some cases. Further, because a downstream side of the blower unit 116 (distal end side of the arrow Ar in FIG. 2) generally tends to become a high temperature, calculation may be performed by setting the surrounding environment temperature Ta set when a heat conductance is calculated, to a higher temperature as a light source gets closer to the downstream side.

FIG. 13 is a diagram illustrating an allowable thermal resistance of each light source. FIG. 13 illustrates the allowable thermal resistance $R_{th}$ in each heat generation amount illustrated in FIG. 5 in a case where the VLED 102, the BLED 104, and the GLD 103 correspond to the light source A with the cooling target temperature Tj=130° C., and the AmLD 101 and the RLED 105 correspond to the light source B with the cooling target temperature Tj=90° C. For example, because a heat generation amount of the VLED 102 in the mode A is 5 W (refer to FIG. 5), the allowable thermal resistance $R_{th}=\Delta T/Q=90/5=18.0$ is obtained.

FIG. 14 is a diagram illustrating a heat conductance of each light source. FIG. 14 illustrates heat conductances $C_{th}$ calculated from the allowable thermal resistances $R_t$n illustrated in FIG. 13. For example, because the allowable thermal resistance $R_{th}$ of the VLED 102 in the mode A is 18.0 (refer to FIG. 13), the heat conductance $C_{th}=1/R_{th}=1/18=0.055\approx 0.06$ is obtained. Further, in the case of the configuration of the prior art in which the light sources from the AmLD 101 to the RLED 105 are individually mounted on the respective heat release portions, each light source needs to be able to release heat in a mode in which the heat conductance $C_{th}$ is the largest, among all modes. Thus, a value in a mode in which the heat conductance $C_{th}$ is the largest is selected. The VLED 102 requires a heat release portion with the heat conductance $C_{th}=0.33$, the BLED 104 requires a heat release portion with the heat conductance $C_{th}=0.11$, the GLD 103 requires a heat release portion with the heat conductance $C_{th}=0.78$, the AmLD 101 requires a heat release portion with the heat conductance $C_{th}=0.50$, and the RLED 105 requires a heat release portion with the heat conductance $C_{th}=0.60$.

FIG. 15 is a diagram illustrating a maximum heat conductance among all modes. FIG. 15 illustrates a heat conductance $C_{th}$ with respect to a total heat generation amount obtained in a case where a light source listed in a lengthwise direction, and a light source listed in a traverse direction are mounted on one heat release portion. For example, in a case where the VLED 102 and the BLD 104 are mounted on one heat release portion, the heat generation amount of 30 W illustrated in FIG. 9 is the maximum heat generation amount among the modes A to C. To release heat with the maximum heat generation amount of 30 W, the allowable thermal resistance $R_{th}=\Delta T/Q=90/30=3.0$ is obtained, and the heat conductance $C_{th}=1/R_{th}=1/3=0.33$ is obtained.

FIG. 16 is a diagram illustrating a heat conductance obtained in a case where each light source independently includes a heat release portion. FIG. 16 can illustrate a heat conductance by a sum of heat conductances in the configuration of the prior art that are illustrated in FIG. 14. For example, a sum of heat conductances $C_{th}$ of the VLED 102 and the BLD 104 become 0.44 by adding 0.33 and 0.11.

FIG. 17 is a diagram illustrating an effect obtained by sharing a heat release portion. FIG. 17 illustrates values obtained by subtracting the values in FIG. 15, from the values in FIG. 16. Nevertheless, if two light sources are mounted on one heat release portion in combinations to which diagonal hatchings are applied in FIG. 17, because electrodes of the respective light sources enter a mutually-non-insulated state, it becomes unable to individually control light amounts of the light emitters. Accordingly, in the case of individually controlling light amounts of the light emitters, it is impossible to mount two light sources on one heat release portion in the combinations to which diagonal hatchings are applied in FIG. 17.

In a case where the VLED 102 and the AmLD 101, which have a maximum absolute value among combinations to which diagonal hatchings are not applied in FIG. 17, are mounted on one heat release portion, as seen from FIG. 15, it is sufficient that the VLED 102 and the AmLD 101 are mounted on the heat release portion 120 with the heat conductance $C_{th}$ of 0.56. In contrast to this, in the prior art, because the VLED 102 and the AmLD 101 are independently mounted on heat release portions, as seen from FIG. 16, a heat release portion with a heat conductance $C_{th}$ of 0.83 has been required. Accordingly, in a case where the VLED 102 and the AmLD 101 are mounted on one heat release portion 120 as in the second embodiment, the heat release portion 120 with the heat conductance $C_{th}$ smaller by 0.27 as compared with that in the prior art can be employed. Because the heat release portion 120 has a surface area set based on the heat conductances $C_{th}$ of the AmLD 101 and the VLED 102, according to the second embodiment, the light source device 100 including a non-insulated light source (VLED 102) can be downsized.

Modified Example 1

Figure 18:
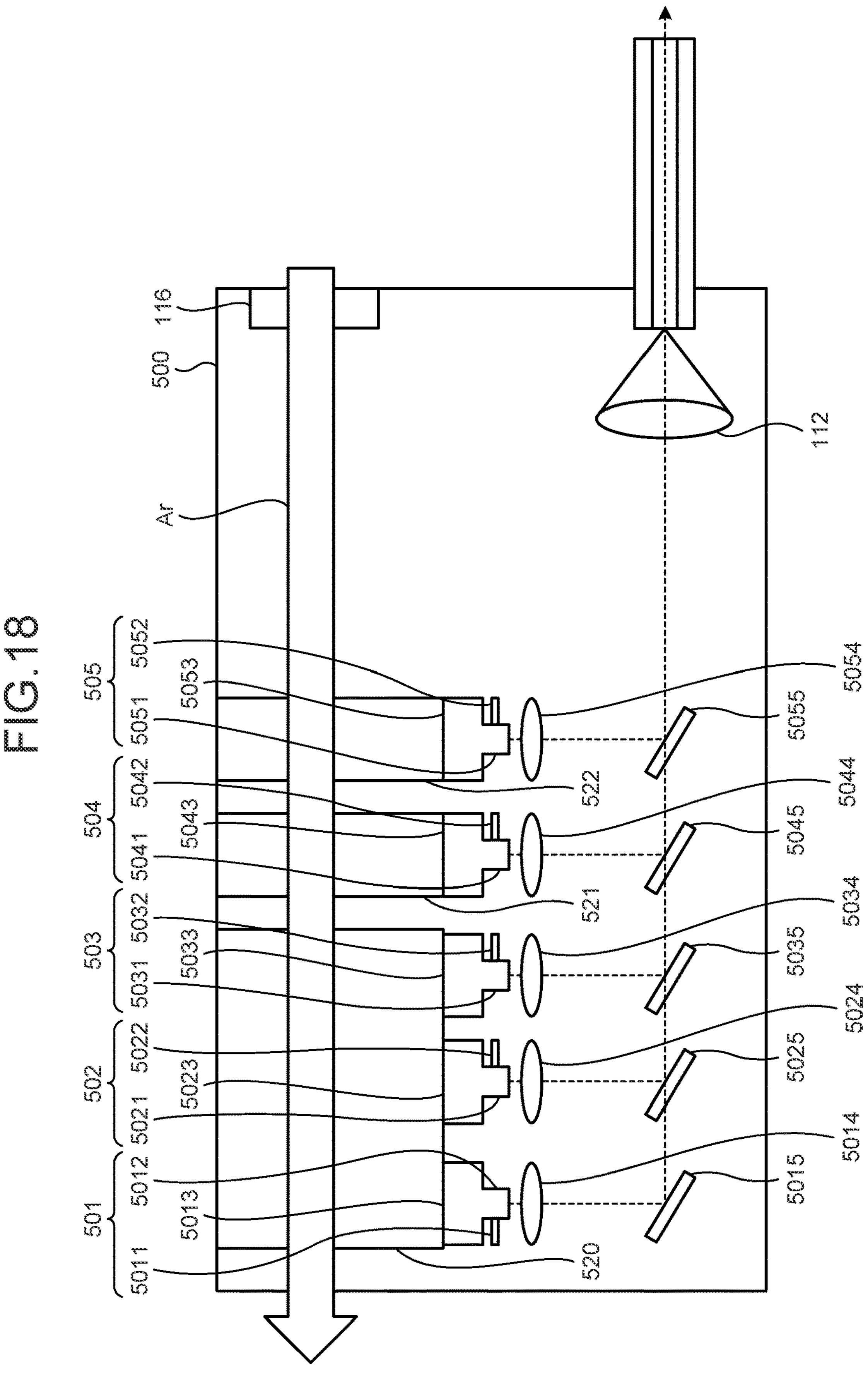
FIG. 18 is a schematic diagram illustrating a configuration of an endoscope observation system including a light source device according to Modified Example 1.

In the first embodiment, the description has been given of an example in which the VLED 102 and the AmLD 101 are mounted on one heat release portion 120, but the example is not limited to this. Three or more light sources may be mounted on one heat release portion. FIG. 18 is a schematic diagram illustrating a configuration of an endoscope observation system including a light source device according to Modified Example 1. As illustrated in FIG. 18, a light source device 500 includes a VLD 501, an insulated GLED 502, an RLED 503, a BLED 504, and an AmLD 505.

Light sources from the VLD 501 to the AmLD 505 respectively include electrodes 5011 to 5051 to which currents are applied, light emitters 5012 to 5052 that emit light rays in mutually-different wavelengths by the currents applied to the electrodes 5011 to 5051, and heat release regions 5013 to 5053 that release heat generated in the light emitters 5012 to 5052. Further, the light source device 500 includes lenses 5014 to 5054, and dichroic mirrors 5015 to 5055. Further, the components similar to those in the first embodiment are assigned the same signs as those in the first embodiment, and the description will be appropriately omitted.

The RLED 503 and the BLED 504, which serve as a first light source, are LEDs, for example. In the RLED 503, the electrode 5031 and the heat release region 5033 are electrically-connected. Similarly, in the BLED 504, the electrode 5041 and the heat release region 5043 are electrically-connected.

The VLD 501 and the AmLD 505, which serve as a second light source, are LDs, for example. The insulated GLED 502 serving as the second light source is an insulated LED in which an electrode and a heat release region are electrically-insulated. In the VLD 501, the electrode 5011 and the heat release region 5013 are electrically-insulated. Similarly, in the insulated GLED 502, the electrode 5021 and the heat release region 5023 are electrically-insulated. Similarly, in the AmLD 505, the electrode 5051 and the heat release region 5053 are electrically-insulated.

The VLD 501, the insulated GLED 502, and the RLED 503 are mounted on a heat release portion 520. In other words, the VLD 501, the insulated GLED 502, and the RLED 503 use one heat release portion 520 in common. Then, because the electrode 5011 and the heat release region 5013 of the VLD 501 are electrically-insulated, the electrode 5011 and the heat release portion 520 are electrically-insulated, because the electrode 5021 and the heat release region 5023 of the insulated GLED 502 are electrically-insulated, the electrode 5021 and the heat release portion 520 are electrically-insulated, and because the electrode 5031 and the heat release region 5033 of the RLED 503 are electrically-connected, the electrode 5031 and the heat release portion 520 are electrically-connected. Accordingly, because the electrode 5011, the electrode 5021, and the electrode 5031 are electrically-insulated from each other, by controlling currents to be applied to the electrode 5011, the electrode 5021, and the electrode 5031, it is possible to individually control light amounts of the VLD 501, the insulated GLED 502, and the RLED 503.

Further, the BLED 504 is mounted on a heat release portion 521. The AmLD 505 is mounted on a heat release portion 522. As described above, because the electrodes 5011 to 5051 are electrically-insulated from each other, it is possible to individually control light amounts of the light sources from the VLD 501 to the AmLD 505. In addition, because the BLED 504 and the AmLD 505 are independently mounted on the respective heat release portions 521 and 522, their electrodes and heat release regions need not be electrically-insulated, but may be insulated.

Further, the heat release portion 520 is thermally connected to the heat release region 5013 of the VLD 501, the heat release region 5023 of the insulated GLED 502, and the heat release region 5033 of the RLED 503. Similarly, the heat release portions 521 and 522 are thermally connected to the heat release regions 5043 and 5053, respectively.

The lenses 5014 to 5054 condense light rays respectively emitted by the light sources from the VLD 501 to the AmLD 505, and convert the light rays into approximately parallel light rays.

The dichroic mirrors 5015 to 5055 reflect light rays in wavebands of light rays that are respectively emitted by the light sources from the VLD 501 to the AmLD 505, and let through light rays in other wavebands.

Next, an effect obtained by sharing a heat release portion will be described. FIG. 19 is a diagram illustrating a sum of heat generation amounts obtained in a case where three light sources share a heat release portion in the mode A. FIG. 19 illustrates total heat generation amounts obtained in all patterns in a case where three light sources units are mounted on one heat release portion in the mode A. For example, in a case where the VLD 501, the BLED 504, and the insulated GLED 502 are mounted on one heat release portion, by adding 5 W being the heat generation amount of the VLD 501 in the mode A, 10 W being the heat generation amount of the BLED 504 in the mode A, and 60 W being the heat generation amount of the insulated GLED 502 in the mode A, which are illustrated in FIG. 5, the total heat generation amount becomes 75 W.

FIG. 20 is a diagram illustrating a sum of heat generation amounts obtained in a case where three light sources share a heat release portion in the mode B. Similarly to FIG. 19, FIG. 20 illustrates total heat generation amounts obtained in all patterns in a case where three light sources units are mounted on one heat release portion in the mode B. For example, in a case where the VLD 501, the BLED 504, and the insulated GLED 502 are mounted on one heat release portion, by adding 30 W being the heat generation amount of the VLD 501 in the mode B, 0 W being the heat generation amount of the BLED 504 in the mode B, and 70 W being the heat generation amount of the insulated GLED 502 in the mode B, which are illustrated in FIG. 5, the total heat generation amount becomes 100 W.

FIG. 21 is a diagram illustrating a sum of heat generation amounts obtained in a case where three light sources share a heat release portion in the mode C. Similarly to FIG. 19, FIG. 21 illustrates total heat generation amounts obtained in all patterns in a case where three light sources units are mounted on one heat release portion in the mode C. For example, in a case where the VLD 501, the BLED 504, and the insulated GLED 502 are mounted on one heat release portion, by adding 0 W being the heat generation amount of the VLD 501 in the mode C, 0 W being the heat generation amount of the BLED 504 in the mode C, and 10 W being the heat generation amount of the insulated GLED 502 in the mode C, which are illustrated in FIG. 5, the total heat generation amount becomes 10 W.

FIG. 22 is a diagram illustrating a maximum heat generation amount among all modes. That is, FIG. 22 illustrates maximum values of the values illustrated in FIGS. 19 to 21. For example, in a case where the VLD 501, the BLED 504, and the insulated GLED 502 are mounted on one heat release portion, because the heat generation amount in the mode A is 75 W (refer to FIG. 19), the heat generation amount in the mode B is 100 W (refer to FIG. 20), and the heat generation amount in the mode C is 10 W (refer to FIG. 21), the maximum heat generation amount becomes 100 W.

FIG. 23 is a diagram illustrating a heat generation amount obtained in a case where each light source independently includes a heat release portion. That is, FIG. 23 illustrates a sum of heat generation amounts illustrated on the bottom-most row in FIG. 5. For example, in a case where the VLD 501, the BLED 504, and the insulated GLED 502 are independently mounted on the respective heat release portions, by adding 30 W being the heat generation amount of the VLD 501, 10 W being the heat generation amount of the BLED 504, and 70 W being the heat generation amount of the insulated GLED 502, which are illustrated in FIG. 5, the total heat generation amount becomes 110 W.

FIG. 24 is a diagram illustrating an effect obtained by sharing a heat release portion. FIG. 24 illustrates values obtained by subtracting the values in FIG. 23, from the values in FIG. 22. Nevertheless, if three light sources are mounted on one heat release portion in combinations to which diagonal hatchings are applied in FIG. 24, because electrodes of the respective light sources enter a mutually-non-insulated state, it becomes unable to individually control light amounts of the light emitters. Accordingly, in the case of individually controlling light amounts of the light emitters, it is impossible to mount three light sources on one heat release portion in the combinations to which diagonal hatchings are applied in FIG. 24.

In a case where the VLD 501, the insulated GLED 502, and the RLED 503, which have a maximum absolute value among combinations to which diagonal hatchings are not applied in FIG. 24, are mounted on one heat release portion, as seen from FIG. 22, it is sufficient that the VLD 501, the insulated GLED 502, and the RLED 503 are mounted on the heat release portion 520 that can release heat of a light source with a heat generation amount of 100 W. In contrast to this, in the prior art, because the VLD 501, the insulated GLED 502, and the RLED 503 are independently mounted on heat release portions, as seen from FIG. 23, a heat release portion that can release heat of a light source with a heat generation amount of 130 W has been required. Accordingly, in a case where the VLD 501, the insulated GLED 502, and the RLED 503 are mounted on one heat release portion 520 as in Modified Example 1, the heat release portion 520 with heat release capability smaller by 30 W as compared with that in the prior art can be employed. Because the heat release portion 520 has a surface area set based on the heat generation amounts of the VLD 501, the insulated GLED 502, and the RLED 503, according to Modified Example 1, the light source device 500 including a non-insulated light source (RLED 503) can be downsized.

Modified Example 2

Figure 25:
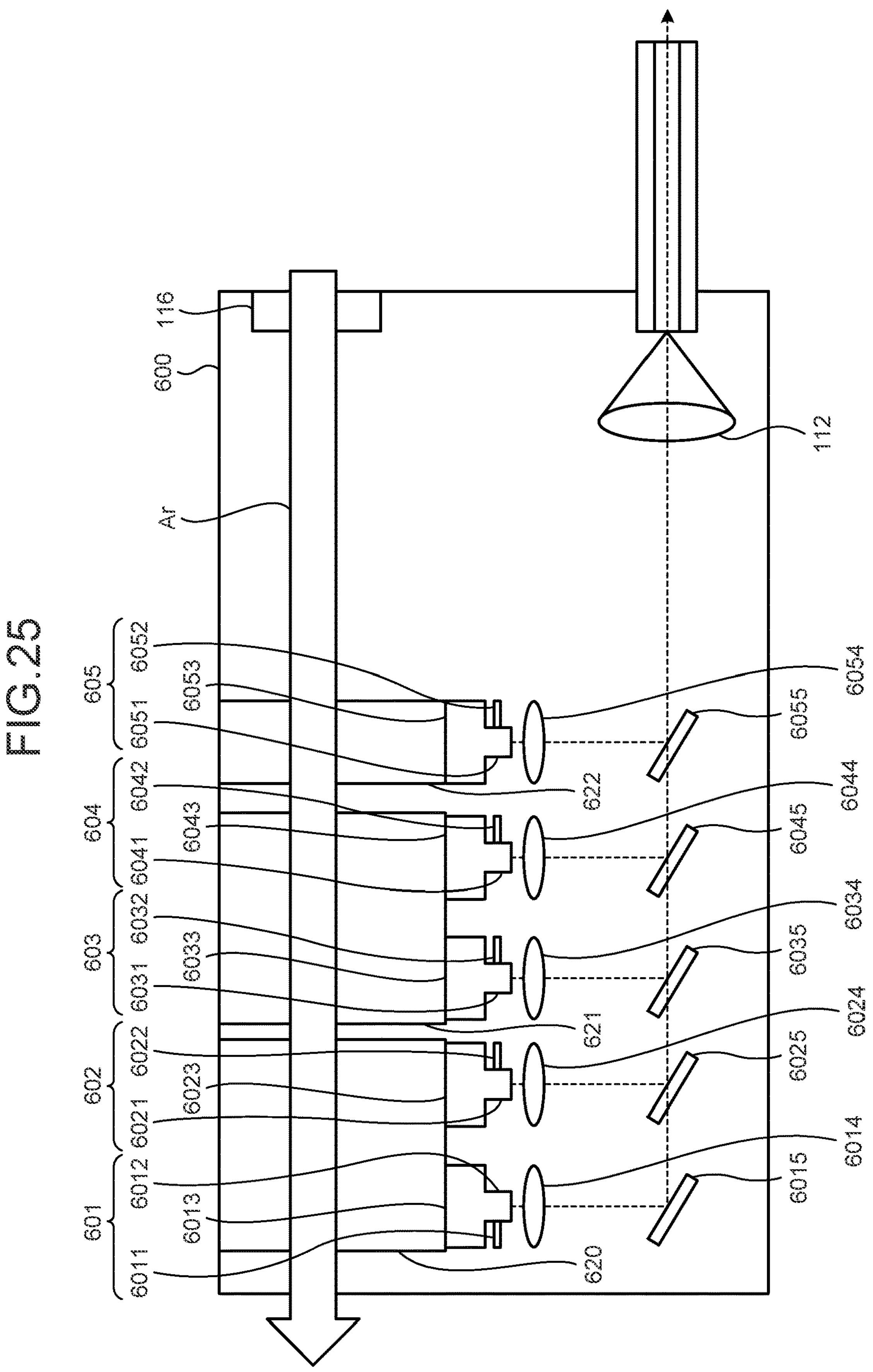
FIG. 25 is a schematic diagram illustrating a configuration of an endoscope observation system including a light source device according to Modified Example 2.

In the first embodiment, the description has been given of an example in which two light sources are mounted on one heat release portion 120, but the example is not limited to this. A plurality of light sources may be mounted on a plurality of heat release portions. FIG. 25 is a schematic diagram illustrating a configuration of an endoscope observation system including a light source device according to Modified Example 2. As illustrated in FIG. 25, a light source device 600 includes a VLD 601, an AmLED 602, a BLD 603, a GLED 604, and an RLED 605.

Light sources from the VLD 601 to the RLED 605 respectively include electrodes 6011 to 6051 to which currents are applied, light emitters 6012 to 6052 that emit light rays in mutually-different wavelengths by the currents applied to the electrodes 6011 to 6051, and heat release regions 6013 to 6053 that release heat generated in the light emitters 6012 to 6052. Further, the light source device 600 includes lenses 6014 to 6054, and dichroic mirrors 6015 to 6055. Further, the components similar to those in the first embodiment are assigned the same signs as those in the first embodiment, and the description will be appropriately omitted.

The AmLED 602 serving as a first light source, and the GLED 604 and the RLED 605, which serve as the first light source, are LEDs, for example. In the AmLED 602, the electrode 6021 and the heat release region 6023 are electrically-connected. Similarly, in the GLED 604, the electrode 6041 and the heat release region 6043 are electrically-connected. Similarly, in the RLED 605, the electrode 6051 and the heat release region 6053 are electrically-connected.

The VLD 601 serving as a second light source, and the BLD 603 serving as the second light source are LDs, for example. In the VLD 601, the electrode 6011 and the heat release region 6013 are electrically-insulated. Similarly, in the BLD 603, the electrode 6031 and the heat release region 6033 are electrically-insulated.

The VLD 601 and the AmLED 602 are mounted on a heat release portion 620. In other words, the VLD 601 and the AmLED 602 use one heat release portion 620 in common. Then, because the electrode 6011 and the heat release region 6013 of the VLD 601 are electrically-insulated, the electrode 6011 and the heat release portion 620 are electrically-insulated, and because the electrode 6021 and the heat release region 6023 of the AmLED 602 are electrically-connected, the electrode 6021 and the heat release portion 620 are electrically-insulated. Accordingly, because the electrode 6011 and the electrode 6021 are electrically-insulated from each other, by controlling currents to be applied to the electrode 6011 and the electrode 6021, it is possible to individually control light amounts of the VLD 601 and the AmLED 602.

The BLD 603 and the GLED 604 are mounted on a heat release portion 621. In other words, the BLD 603 and the GLED 604 use one heat release portion 621 in common. Then, because the electrode 6031 and the heat release region 6033 of the BLD 603 are electrically-insulated, the electrode 6031 and the heat release portion 621 are electrically-insulated, and because the electrode 6041 and the heat release region 6043 of the GLED 604 are electrically-connected, the electrode 6041 and the heat release portion 621 are electrically-insulated. Accordingly, because the electrode 6031 and the electrode 6041 are electrically-insulated from each other, by controlling currents to be applied to the electrode 6031 and the electrode 6041, it is possible to individually control light amounts of the BLD 603 and the GLED 604.

Further, the RLED 605 is mounted on a heat release portion 622. As described above, because the electrodes 6011 to 6051 are electrically-insulated from each other, it is possible to individually control light amounts of the light sources from the VLD 601 to the RLED 605. In addition, because the RLED 605 is independently mounted on the heat release portion 622, its electrode and heat release region need not be electrically-insulated, but may be insulated.

Further, the heat release portion 620 is thermally connected to the heat release region 6013 of the VLD 601 and the heat release region 6023 of the AmLED 602. Similarly, the heat release portion 620 is thermally connected to the heat release region 6033 of the BLD 603 and the heat release region 6043 of the GLED 604. The heat release portion 622 is thermally connected to the heat release region 6053.

The lenses 6014 to 6054 condense light rays respectively emitted by the light sources from the VLD 601 to the RLED 605, and convert the light rays into approximately parallel light rays.

The dichroic mirrors 6015 to 6055 reflect light rays in wavebands of light rays that are respectively emitted by the light sources from the VLD 601 to the RLED 605, and let through light rays in other wavebands.

Next, an effect obtained by sharing a heat release portion will be described. FIG. 26 is a diagram illustrating a pattern for sharing a heat release portion by two sets each including two light sources. In FIG. 26, a double circle pair and a filled circle pair each indicate a pair of light sources that share a heat release portion, and 21 patterns in total can be considered.

FIG. 27 is a diagram illustrating a sum of heat generation amounts of each pattern in the mode A. FIG. 27 illustrates heat generation amounts obtained in the mode A in a share A (corresponds to the double circle in FIG. 26), and a share B (corresponds to the filled circle in FIG. 26), in a case where a heat release portion is shared as in each pattern illustrated in FIG. 26, and obtained in a case where a light source is independently mounted on a heat release portion. For example, in a case where the VLD 601 and the BLD 603 are mounted on one heat release portion, by adding 5 W being the heat generation amount of the VLD 601 in the mode A, and 10 W being the heat generation amount of the BLD 603 in the mode A, which are illustrated in FIG. 5, a heat generation amount of the share A becomes 15 W. In a case where the GLED 604 and the AmLED 602 are mounted on one heat release portion, by adding 60 W being the heat generation amount of the GLED 604 in the mode A, and 25 W being the heat generation amount of the AmLED 602 in the mode A, which are illustrated in FIG. 5, a heat generation amount of the share B becomes 85 W. A heat generation amount obtained in a case where the RLED 605 is independently mounted is 30 W.

FIG. 28 is a diagram illustrating a sum of heat generation amounts of each pattern in the mode B. FIG. 28 illustrates heat generation amounts obtained in the mode B in the share A and the share B, in a case where a heat release portion is shared as in each pattern illustrated in FIG. 26, and obtained in a case where a light source is independently mounted on a heat release portion. For example, in a case where the VLD 601 and the BLD 603 are mounted on one heat release portion, by adding 30 W being the heat generation amount of the VLD 601 in the mode B, and 0 W being the heat generation amount of the BLD 603 in the mode B, which are illustrated in FIG. 5, a heat generation amount of the share A becomes 30 W. In a case where the GLED 604 and the AmLED 602 are mounted on one heat release portion, by adding 70 W being the heat generation amount of the GLED 604 in the mode B, and 0 W being the heat generation amount of the AmLED 602 in the mode B, which are illustrated in FIG. 5, a heat generation amount of the share B becomes 70 W. A heat generation amount obtained in a case where the RLED 605 is independently mounted is 0 W.

FIG. 29 is a diagram illustrating a sum of heat generation amounts of each pattern in the mode C. FIG. 29 illustrates heat generation amounts obtained in the mode C in the share A and the share B, in a case where a heat release portion is shared as in each pattern illustrated in FIG. 26, and obtained in a case where a light source is independently mounted on a heat release portion. For example, in a case where the VLD 601 and the BLD 603 are mounted on one heat release portion, by adding 0 W being the heat generation amount of the VLD 601 in the mode C, and 0 W being the heat generation amount of the BLD 603 in the mode C, which are illustrated in FIG. 5, a heat generation amount of the share A becomes 0 W. In a case where the GLED 604 and the AmLED 602 are mounted on one heat release portion, by adding 10 W being the heat generation amount of the GLED 604 in the mode C, and 10 W being the heat generation amount of the AmLED 602 in the mode C, which are illustrated in FIG. 5, a heat generation amount of the share B becomes 20 W. A heat generation amount obtained in a case where the RLED 605 is independently mounted is 5 W.

FIG. 30 is a diagram illustrating a maximum heat generation amount among all modes. That is, FIG. 30 illustrates maximum values of the values illustrated in FIGS. 27 to 29. For example, in the case of the share A in a pattern No. 1, because the heat generation amount in the mode A is 15 W (refer to FIG. 27), the heat generation amount in the mode B is 30 W (refer to FIG. 28), and the heat generation amount in the mode C is 0 W (refer to FIG. 29), the maximum heat generation amount becomes 30 W. For example, in the case of the share B in the pattern No. 1, because the heat generation amount in the mode A is 85 W (refer to FIG. 27), the heat generation amount in the mode B is 70 W (refer to FIG. 28), and the heat generation amount in the mode C is 20 W (refer to FIG. 29), the maximum heat generation amount becomes 85 W. Further, in a case where a light source is independently mounted in the pattern No. 1, because the heat generation amount in the mode A is 30 W (refer to FIG. 27), the heat generation amount in the mode B is 0 W (refer to FIG. 28), and the heat generation amount in the mode C is 5 W (refer to FIG. 29), the maximum heat generation amount becomes 30 W.

FIG. 31 is a diagram illustrating a heat generation amount obtained in a case where each light source independently includes a heat release portion. That is, FIG. 31 illustrates a sum of heat generation amounts illustrated on the bottom-most row in FIG. 5. For example, in the case of the share A in the pattern No. 1, by adding 30 W being the heat generation amount of the VLD 601, and 10 W being the heat generation amount of the BLD 603, which are illustrated in FIG. 5, a total heat generation amount becomes 40 W. Similarly, in the case of the share B in the pattern No. 1, by adding 70 W being the heat generation amount of the GLED 604, and 25 W being the heat generation amount of the AmLED 602 which are illustrated in FIG. 5, a total heat generation amount becomes 95 W. Further, in the pattern No. 1, a heat generation amount obtained in a case where the RLED 605 is independently mounted is 30 W.

FIG. 32 is a diagram illustrating an effect obtained by sharing a heat release portion. FIG. 32 illustrates values obtained by subtracting the values in FIG. 31, from the values in FIG. 30. In the case of patterns Nos. 7, 9, 10, 12, 13, and 14 that have a maximum absolute value of 35 among patterns illustrated in FIG. 32, a heat release portion with heat release capability smaller by 35 W as compared with that in the prior art can be employed. Because the heat release portion 620 has a surface area set based on the heat generation amounts of the VLD 601 and the AmLED 602, and the heat release portion 621 has a surface area set based on the heat generation amounts of the BLD 603 and the GLED 604, according to Modified Example 2, the light source device 600 including a non-insulated light source (VLD 601, BLD 603) can be downsized.

According to the disclosure, it is possible to implement a light source device that can downsize a light source device including a non-insulated light source.

Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light source device comprising:

a first light source including a first electrode to which a current is applied, a first light emitter configured to emit light by the current applied to the first electrode, and a first heat release region configured to release heat generated in the first light emitter;

a second light source including a second electrode to which a current is applied, a second light emitter configured to emit light in a wavelength different from a wavelength of the first light emitter, by the current applied to the second electrode, and a second heat release region configured to release heat generated in the second light emitter; and a heat release portion electrically-connected with the first electrode, electrically-insulated from the second electrode, and thermally connected to the first heat release region and the second heat release region.

2. The light source device according to claim 1, wherein a light source controller configured to independently control the current to be applied to the first electrode, and the current to be applied to the second electrode.

3. The light source device according to claim 1, wherein the second light source is a laser diode (LD), a light emitting diode (LED) in which the first electrode and the first heat release region are electrically-insulated, or an LED in which the first electrode and the first heat release region are electrically-connected and an insulation portion positioned between the first heat release region and the heat release portion is included.

4. The light source device according to claim 1, wherein the heat release portion has a surface area set based on heat generation amounts of the first light source and the second light source.

5. The light source device according to claim 1, wherein the heat release portion has a surface area set based on heat conductances of the first light source and the second light source.

6. The light source device according to claim 1, further comprising a third light source including a third electrode to which a current is applied, a third light emitter configured to emit light by the current applied to the third electrode, and a third heat release region configured to release heat generated in the third light emitter, wherein the heat release portion is electrically-insulated from the third electrode, and thermally connected to the third heat release region.

7. The light source device according to claim 1, further comprising:

a fourth light source including a fourth electrode to which a current is applied, a fourth light emitter configured to emit light by the current applied to the fourth electrode, and a fourth heat release region configured to release heat generated in the fourth light emitter;

a fifth light source including a fifth electrode to which a current is applied, a fifth light emitter configured to emit light by the current applied to the fifth electrode, and a fifth heat release region configured to release heat generated in the fifth light emitter; and a second heat release portion electrically-connected with the fourth electrode, electrically-insulated from the fifth electrode, and thermally connected to the fourth heat release region and the fifth heat release region.

8. The light source device according to claim 1, wherein a surface area of the heat release portion is set to release heat corresponding to a total heat generation amount of the first light emitter and the second light emitter.

9. The light source device according to claim 8, wherein the first light emitter and the second light emitter are configured to emit light with a first light amount in a first observation mode, wherein the first light emitter and the second light emitter are configured to emit light with a second light amount different from the first light amount in a second observation mode, and wherein the surface area of the heat release portion is set to release heat corresponding to a larger total heat generation amount in a total heat generation amount of the first light emitter and the second light emitter that is obtained when the light with the first light amount is emitted, and a total heat generation amount of the first light emitter and the second light emitter that is obtained when the light with the second light amount is emitted.

* * * * *